(12) United States Patent
Peterson et al.

(10) Patent No.: US 6,255,776 B1
(45) Date of Patent: Jul. 3, 2001

(54) DISPLAY DEVICE AND METHOD THEREFOR

(75) Inventors: Francis Peterson, Prescott; David Walsh, River Falls, both of WI (US)

(73) Assignee: Phillips Plastics Corporation, Prescott, WI (US)

( * ) Notice: Subject to any disclaimer, the term of this patent is extended or adjusted under 35 U.S.C. 154(b) by 0 days.

(21) Appl. No.: 09/329,481

(22) Filed: Jun. 10, 1999

Related U.S. Application Data (60) Division of application No. 08/988,011, filed on Dec. 10, 1997, now abandoned, which is a continuation-in-part of application No. 08/847,197, filed on May 1, 1997.

(51) Int. Cl.⁷ .................. H01J 1/62; G09G 3/22
(52) U.S. Cl. .......... 313/506; 313/505; 313/500; 313/509
(58) Field of Search .................. 313/502, 499, 313/506, 500, 505, 504, 509; 315/169.3

(56) References Cited

U.S. PATENT DOCUMENTS

| | | | |
|---|---|---|---|
| 3,075,122 | * 1/1963 | Lehmann | 313/509 X |
| 3,519,871 | 7/1970 | Kaine | 313/108 |
| 4,831,504 | 5/1989 | Nishizawa et al. | 362/100 |
| 5,127,626 | 7/1992 | Hilal et al. . | |
| 5,364,372 | 11/1994 | Danks et al. . | |
| 5,538,509 | 7/1996 | Dunlap et al. . | |
| 5,545,150 | 8/1996 | Danks et al. . | |
| 5,565,733 | 10/1996 | Krafcik et al. | 313/510 |
| 5,574,327 | 11/1996 | Cammack et al. | 313/110 |
| 5,580,344 | 12/1996 | Hasson . | |
| 5,634,937 | 6/1997 | Mollenauer et al. . | |
| 6,054,809 | 4/2000 | Haynes et al. | 313/505 |

FOREIGN PATENT DOCUMENTS

| | | |
|---|---|---|
| 38 02 317 | 8/1989 | (DE) . |
| 0 302 463 | 2/1989 | (EP) . |
| 0 334 799 | 9/1989 | (EP) . |
| 06104087 | 4/1994 | (JP) . |
| WO 94/14180 | 6/1994 | (WO) . |

\* cited by examiner

*Primary Examiner*—Ashok Patel
(74) *Attorney, Agent, or Firm*—McDermott, Will & Emery (57) ABSTRACT

An electroluminescent display includes thin conductive strips on a phosphor-deposited area. One aspect of the invention is directed to a device including a dielectric carrier supporting a first conductive bus connecting to first conductors and a second conductive bus connecting to second conductors. The first and second conductors are arranged in close proximity to one another, so that a phosphor-based carrier can be located therebetween to permit an electric field set up by a voltage applied between the first and second conductors to generate light via the phosphors. A dielectric layer disposed between the conductors enhances the brightness of the light generated. The electroluminescent display can be incorporated as part of a mirror or liquid crystal device.

6 Claims, 8 Drawing Sheets

DISPLAY DEVICE AND METHOD THEREFOR

Div of Ser. No. 08/988,011 filed Dec. 10, 1997, Abn This application is a Continuation-in-Part of U.S. patent application Ser. No. 08/847,197, filed May 1, 1997.

FIELD OF THE INVENTION

The present invention relates to electronically-controlled displays that can be manufactured as parts of other functional structures. More particularly, the present invention relates to electronic displays, including electroluminescent displays, that can be manufactured as parts of other functional structures.

BACKGROUND OF THE INVENTION

Displays are implemented using a variety of technology areas for use in a wide variety of applications. The technology areas span from the cathode ray tube (CRT), to various field emission display technologies, to light-emitting diode technologies, etc. The uses and applications of displays are without limit. For example, consider some display devices, such as with alphanumeric displays and computer-type display screens, whose primary purpose is to display information, and other display devices that serve secondary functions, such as backlighting user access points or controls. For many of these applications, the size and manufacturability of the display devices are major concerns.

As an example, electroluminescence is one of several popular display technologies that have been used in view of size constraints. Common uses of electroluminescence include, among other uses, backlighting watches and display screens in certain laptop and notebook computers. Electroluminescence technology is conventionally implemented using phosphor material sandwiched between two conductive layers. One of the conductive layers is typically a transparent material, such as mylar, that is coated with a transparent conductor, such as indium tin oxide. When a high voltage of alternating polarity is applied to the respective conductive layers, an electric field is created that excites the phosphor.

Manufacturing devices using displays of this type are cumbersome. In the design of a typical application, at least a three-layer electroluminescent display structure is cooperatively arranged nearby another circuit. This neighboring circuit is arranged to avoid blocking the electroluminescent light, and the electroluminescent display structure is arranged to avoid interfering with the functionality of the neighboring circuit. For many applications, especially those requiring significant generation of light in compact areas, this cooperative arrangement is not practicable.

Accordingly, many applications require displays that can be implemented in small areas while avoiding the disadvantages discussed above.

SUMMARY OF THE INVENTION

One aspect of the present invention is directed to an electroluminescent display device. The display device includes first and second conductive buses adjacent to an electroluminescent medium on a dielectric carrier. The first and second conductive buses have at least one first conductor and at least one second conductor, respectively. These conductors are arranged in close proximity to one another, and they are secured over and supported by the dielectric carrier. The electroluminescent medium is located proximate to the first and second conductors to permit an electric field set up by a voltage applied between the first and second conductors to generate light. In more specific embodiments, the medium is phosphor-based and polymer-based, respectively.

Another aspect of the present invention is directed to a method for manufacturing the above-described electroluminescent display device. According to one embodiment, the method provides the manufacture of a electroluminescent display device on a dielectric carrier. The method includes: applying a first conductive bus having at least one first conductor, and a second conductive bus having at least one second conductor, arranged in close proximity to said at least one first conductor, over the dielectric carrier and forming at least one area therebetween; and depositing a phosphor-based carrier in said at least one area between the first and second conductors, the first and second conductors arranged to excite the phosphors and generate light therefrom.

Another aspect of the present invention is directed to improving the brightness of the device or to improving the method, as described above, by applying a nonconductive material, such as DuPont 7153-type dielectric composition, over the patterned conductive buses, or by using another such material to increase capacitance between the alternately arranged conductors. It has been discovered that such implementation substantially increases the brightness. In a particular application, the brightness has been doubled by using a thin layer of this nonconductive material applied directly over the entire patterned conductive areas. Other materials of this type, e.g., other dielectric compositions, can be used as well.

According to another embodiment of the present invention, an electroluminescent display device is formed on a mirror having a metallized surface. The metallized surface is selectively etched to define a first conductive bus having at least one first conductor and a second conductive bus having at least one second conductor arranged in close proximity to the at least one first conductor. A phosphor-based carrier including phosphor therein is located proximate to the first and second conductors to permit an electric field set up by a voltage applied between the first and second conductors to generate light via the phosphor. The mirror can form part of a liquid crystal device.

Another aspect of the present invention is directed to a method for manufacturing an electroluminescent display device on a mirror having a metallized surface. The metallized surface is selectively etched, defining a first conductive bus having at least one first conductor and a second conductive bus having at least one second conductor in close proximity to the at least one first conductor and forming at least one area between the at least one first conductor and the at least one second conductor. A phosphor-based carrier having a phosphor is deposited in the at least one area. The first and second conductors are arranged to excite the phosphor and generate light therefrom in response to an applied voltage.

The above summary of the present invention is not intended to describe each disclosed embodiment, or every implementation, of the present invention. The figures and the detailed description that follow more particularly exemplify these embodiments.

BRIEF DESCRIPTION OF THE DRAWINGS

Other aspects and advantages of the invention will become apparent upon reading the following detailed description and upon reference to the drawings, in which.

While the invention is susceptible to various modifications and alternative forms, specifics thereof have been shown by way of example in the drawings and will be described in detail. It should be understood, however, that the intention is not to limit the invention to the particular embodiment described. On the contrary, the intention is to cover all modifications, equivalents, and alternatives falling within the spirit and scope of the invention as defined by the appended claims.

DETAILED DESCRIPTION

The present invention is believed to be useful for a variety of applications requiring or benefiting from display devices that can be implemented in relatively small areas. While the present invention is not intended to be so limited, an appreciation of the present invention is best obtained through a discussion of particular example applications, including an electroluminescent display device constructed in accordance with a particular embodiment of the present invention.

Figure 1:
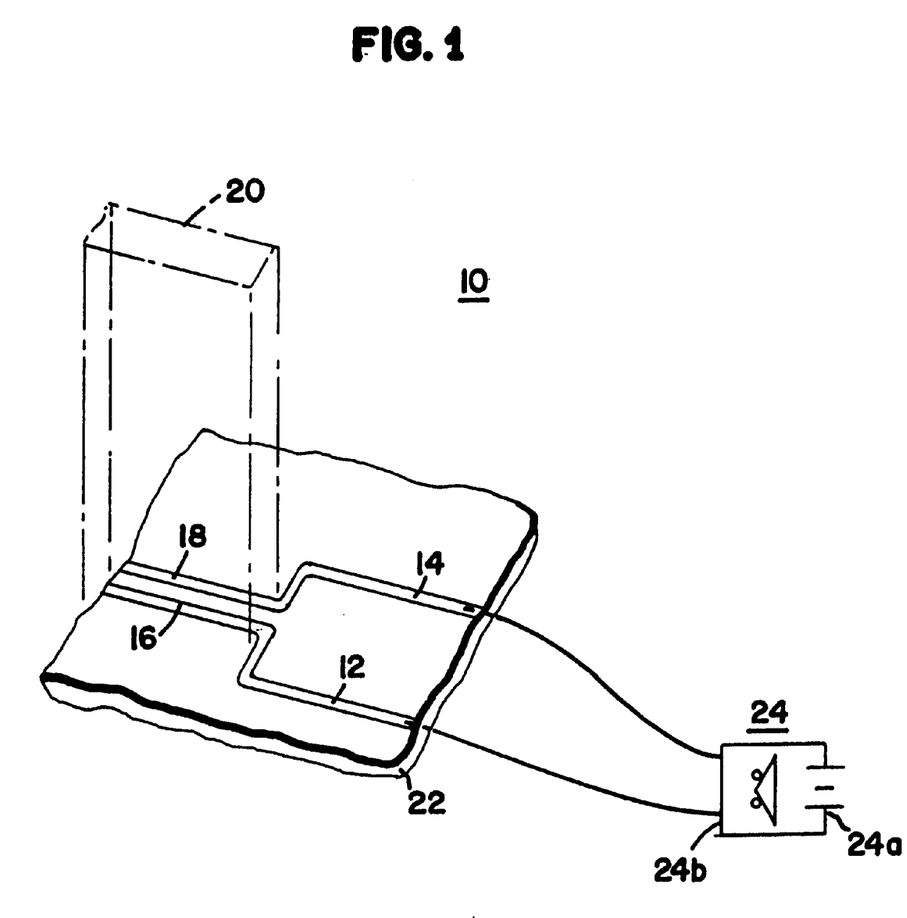
FIG. 1 is an exaggerated, perspective view of an electroluminescent display device, according to one embodiment of the present invention.

One important aspect of the present invention is directed to the implementation of devices including an electroluminescent display, for example, as illustrated in the exaggerated, perspective view of the display construction 10 of FIG. 1. The display construction 10 includes first and second conductive buses 12 and 14 including respective first and second display runners or conductors 16 and 18. By locating the conductors 16 and 18 in close proximity to one another and disposing a phosphor-based carrier 20 between the two conductors 16 and 18, a conventional electroluminescent inverter circuit 24 can be connected across the two buses 12 and 14 to set up an electric field and generate light via the phosphor material in the carrier. In the particular example illustrated, the display generates light along a single line between the conductors 16 and 18. It will be understood that the "buses" may be as illustrated as a wider portion of the conductor extending from the inverter terminal or may be constructed and arranged as merely an indistinguishable and continuous part of the conductor(s) emanating therefrom.

Figure 2A:
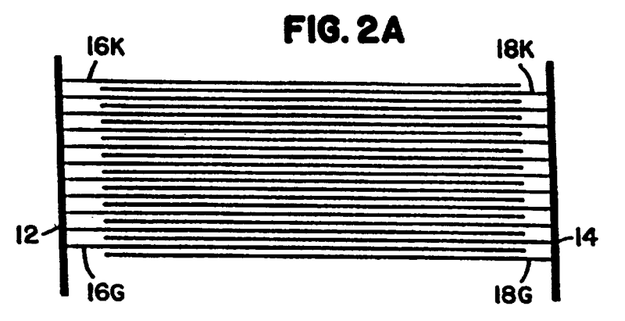
FIGS. 2a, 2b, and 2c illustrate respective top views of three different conductor layouts for exciting phosphor in an electroluminescent display device.
Figure 2B:
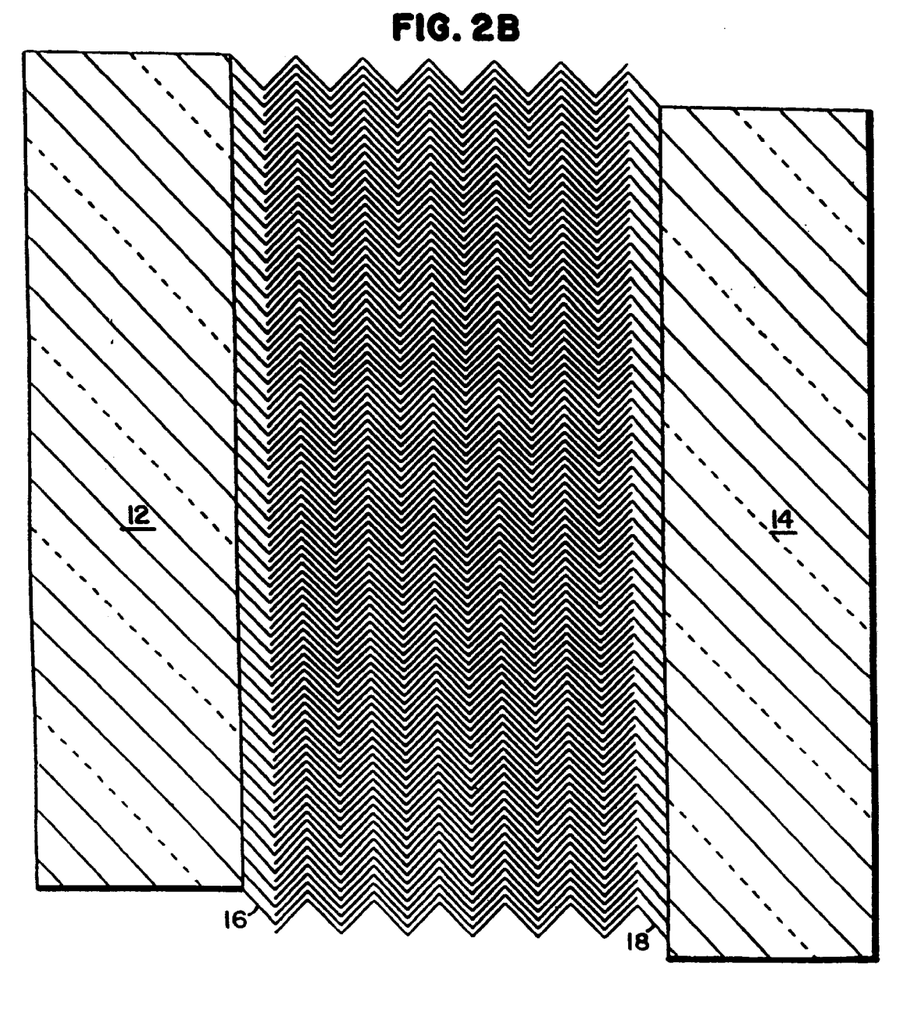

By extending the phosphor-based carrier 20 so that it resides between other conductors and/or between the bus conductors 12 and 14, displays in non-linear shapes and different sizes can be realized. As illustrated in the embodiment of FIG. 2a, for example, the conductors 16 and 18 of FIG. 1 are respectively replaced or supplemented by a plurality of first conductors 16a through 16k and a plurality of second conductors 18a through 18k. The first conductors 16a through 16k are interleaved with the second conductors 18a through 18k, to create a multitude (eleven in the example illustration) of phosphor-energizable areas, one such area in the proximity of each opposing pair (e.g., 16a and 18a) of conductors. FIG. 2b provides another example configuration wherein the bus conductors 12 and 14 are widened to increase the current-carrying capability of the buses and wherein the conductors, generally designated as 16 and 18, are interleaved and aligned in a zig-zag pattern for an esthetically-specific display application. Other shapes, including, but not limited to, curvilinear and non-linear shapes, can also be implemented as supplements or alternatives to the above conductor constructions.

Figure 2C:
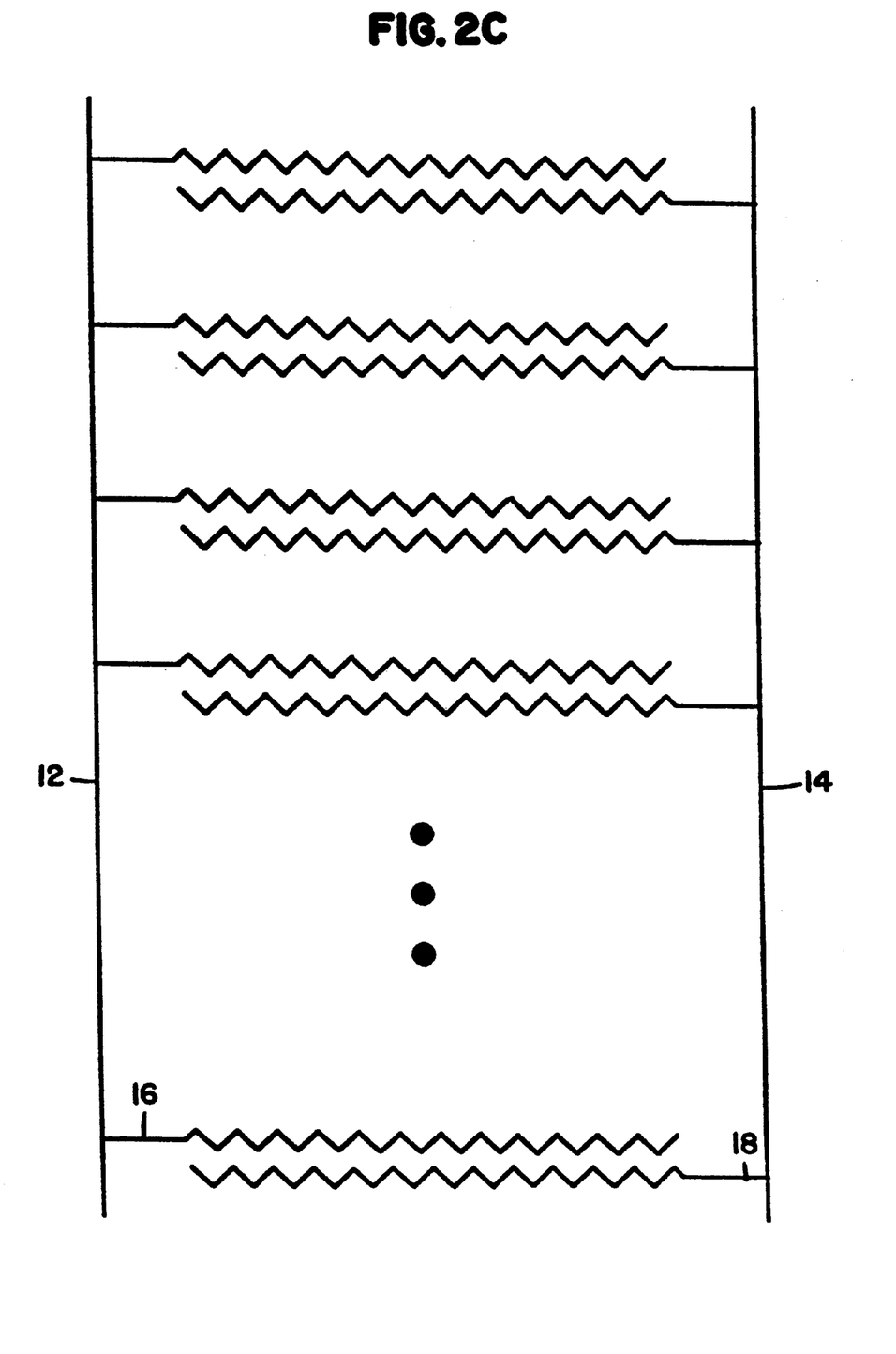

According to another important aspect of the present invention, FIG. 2c illustrates a configuration wherein the conductors 16 and 18 are serrated to form energy-generating tips. As the polarity of the energy between opposing conductors changes, the changing E-field at the opposing tips is concentrated, thereby enhancing brightness. For enhanced lighting generated at the phosphor-energizable areas defined by the opposing conductors, the frequency of the tips per unit of linear measure is increased.

Figure 2D:
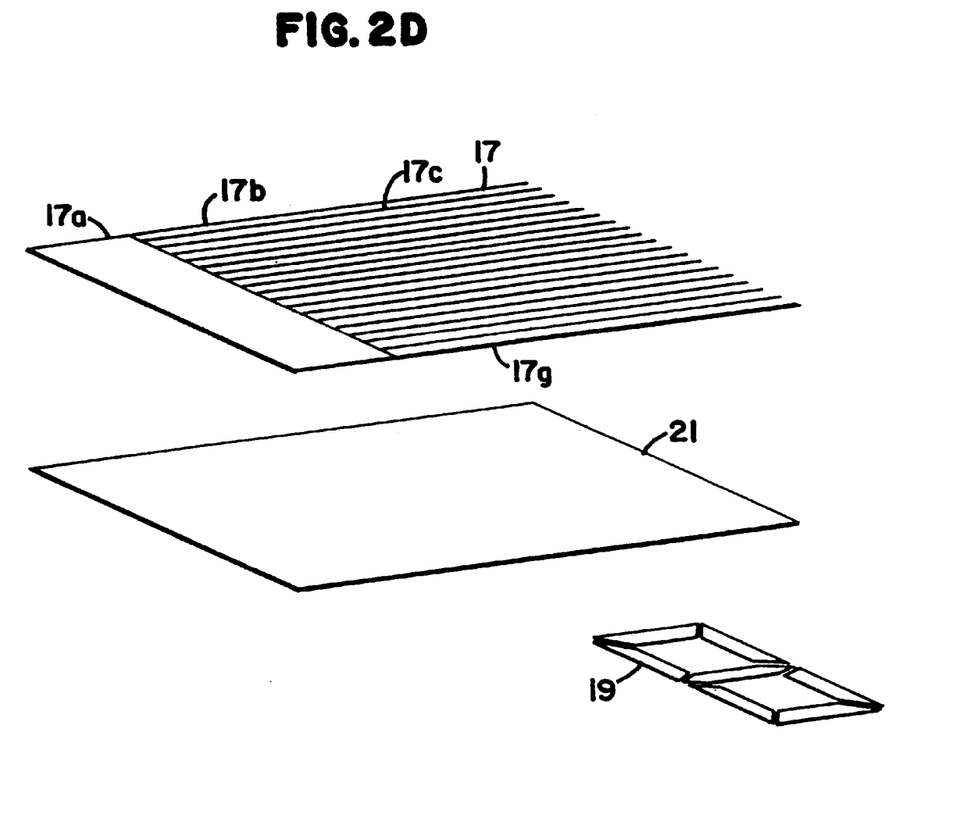
FIG. 2d illustrates a perspective view of another conductor layout for exciting phosphor in an electroluminescent display device, each of the respective layouts being in accordance with the present invention.

According to yet another important aspect of the present invention, FIG. 2d illustrates a configuration wherein a fingered conductor 17 and a polarity-opposing graphic conductor 19 are separated by a dielectric 21, such as a thin sheet of mylar. The conductor 17 is covered by (or, alternatively, covers) a layer of phosphor-based material. The conductor 17, which may include a finger-extending bus portion 17a, includes separated fingers 17b–17q arranged over the graphic conductor 19. As the polarity of the energy between the conductors 17 and 19 changes, the changing E-field at the opposing tips illuminates the shape of the graphic conductor 19 on the side of the clear dielectric 21 carrying the conductor 17. The conductors 17, 19 and the phosphor-based material may be applied as described herein in connection with FIGS. 2a, 2b and 2c.

In a more specific embodiment consistent with the approach of FIG. 2d, the graphic conductor 19 is implemented as separated conductors with each separated conductor carrying the opposing charge in an alternative manner. A control circuit, such as a programmed microprocessor and selectable encoder (or functional equivalent such as an ASIC), passes the opposing charge to each of the separated conductors to illuminate selected portions of the desired graphic display.

Figure 3:
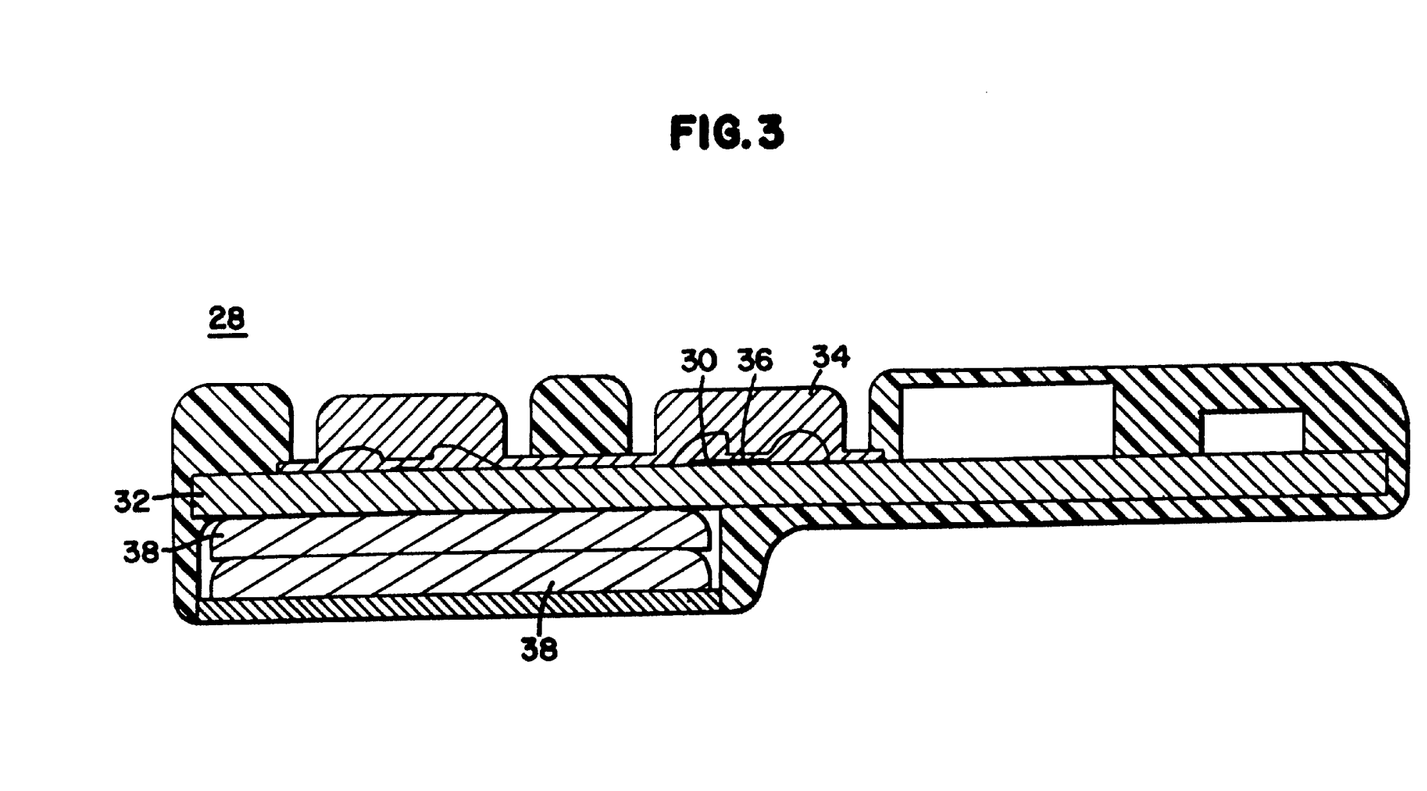
FIG. 3 is a side view of a backlit remote control device, according to a particular application and embodiment of the present invention, employing an electroluminescent display consistent with the illustration of FIG. 1.

Among other benefits and advantages, these above-disclosed embodiments permit a relatively inexpensive and straightforward manufacture of displays on any of a variety of dielectric carriers 22 and, where beneficial, as an integral part of other functional devices. Referring to FIG. 3, for example, a battery-operated remote control 28 includes, as integral parts, an electronic display 30, such as illustrated above, and a conventional switch circuit. The electronic display 30 is printed on the control-access side of a printed circuit board (PCB) 32. The PCB 32 carries conventional components (not shown in FIG. 3) including circuit-connecting conductors, a signal transmitter, and a control circuit. The switch circuit includes a conductor-carrying depressor 34 opposite the PCB 32 and wire-terminating contacts 36 on the PCB adjacent the electronic display 30. The depressor 34 includes at least a portion that is transparent to permit passage of light generated by the electronic display. The electroluminescent inverter is optionally arranged as part of the control circuit carried by the PCB 32.

A battery circuit 24a is used, selectively or as required, to energize the electroluminescent inverter (24b of FIG. 3). For example, upon first engagement of any of the depressors of the remote control device, the control circuit switches power on to the electroluminescent inverter and maintains such power for a predetermined period of time to permit the user to distinguish the keys from one another. In this mode, the control circuit includes a conventional firmware- or hardware-implemented debounce circuit to prevent erroneous readings of the switches as can be caused by the user inadvertently striking the same switch repeatedly or multiple switches at about the same time.

Figure 4:
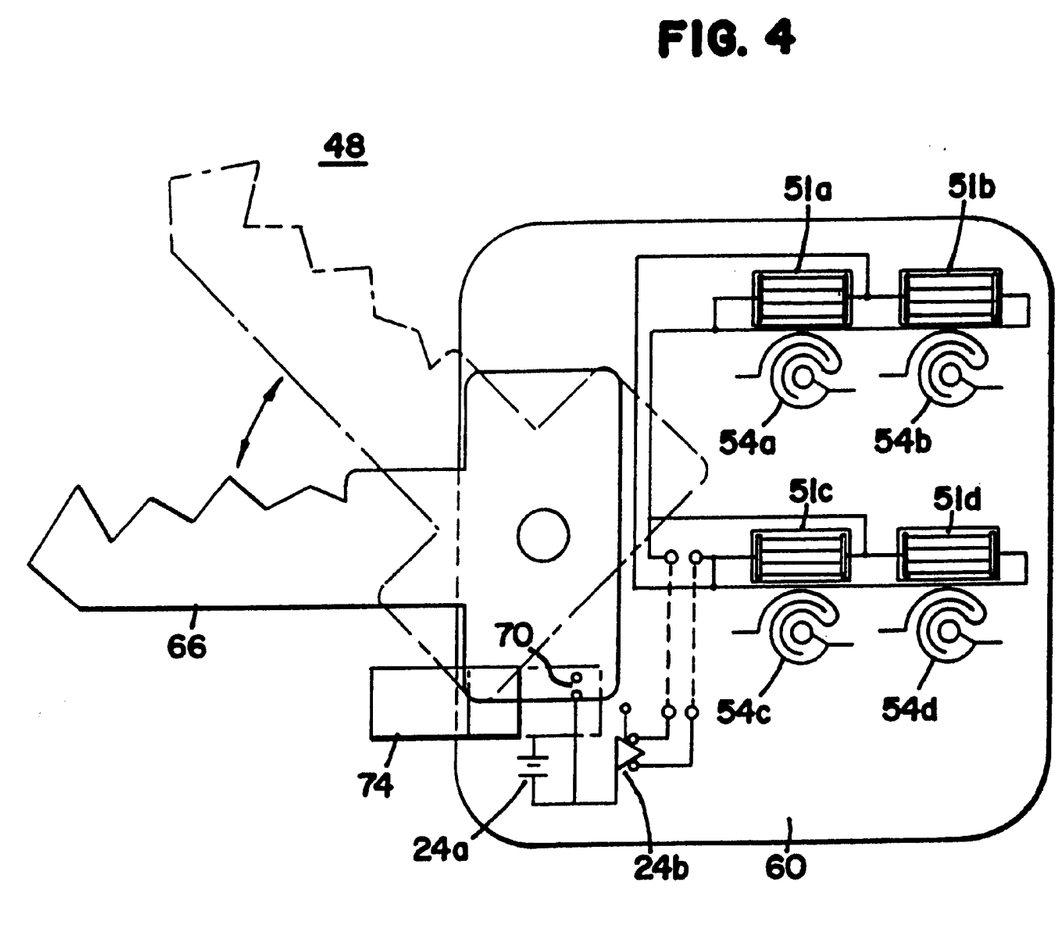
FIG. 4 is a top view of an electroluminescent display arranged as part of a combination key and integrated circuit, according to a particular application and embodiment of the present invention.

FIG. 4 illustrates a battery-operated remote control key device 48 with integral parts including electronic displays 51a, 51b, 51c and 51d for backlighting associated switch circuits, the wire-terminating contacts of which are designated 54a, 54b, 54c and 54d. Each of the electronic displays 51a, 51b, 51c and 51d are implemented on the surface side of an integrated-circuit (chip) and configured, for example, as indicated above in connection with FIG. 2a, 2b or 2c.

The battery circuit 24a for this implementation can be used selectively in response to engagement of a mechanical conductor. For example, rotation of the metallic portion 66 of the key device 48 can be used to short a pair of terminals 70 and, in turn, inform the control circuit 60 that the electroluminescent inverter 24b is to be energized for a predetermined period of time. Alternatively, a user can depress a conductive, friction-fitting, slidable post 74 to provide the same input as rotating the key of the control circuit 60. As another alternative, or in addition, first engagement of any of the depressor portions of the switch circuit can inform the control circuit of the need to energize for the designated period of time, as described above in connection with FIG. 3.

Figure 5:
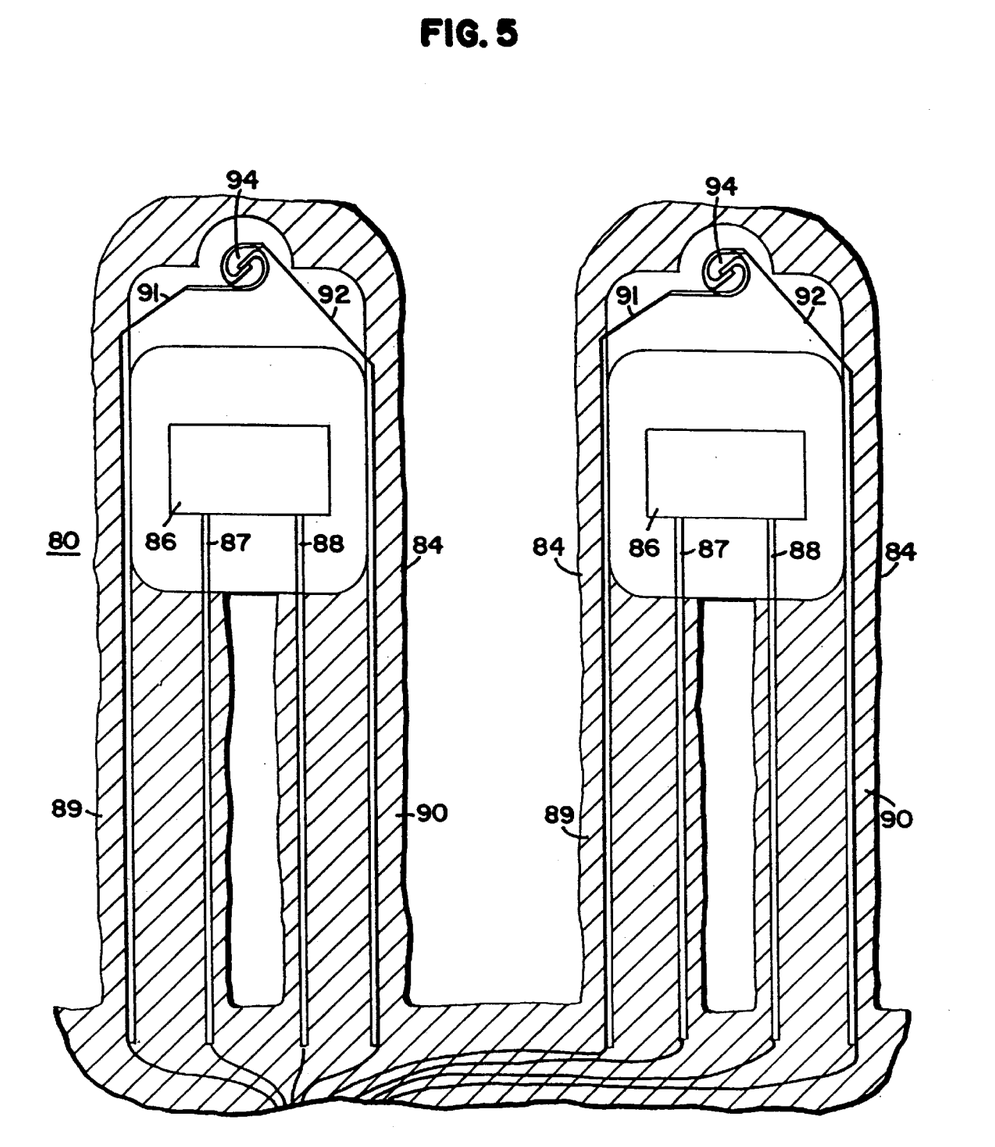
FIG. 5 is a view of a backlit button configured as part of a set of buttons and an employing electroluminescent display consistent with the illustration of FIG. 1, all of which is in accordance with a particular application and embodiment of the present invention.

FIG. 5 illustrates a portion of another remote control device having a plurality of hinged depressors 84 arranged in parallel and as part of an overall molded plastic unit 80. The remote control device of FIG. 5 is similar to the device of FIG. 4 in terms of the display and switch construction and general electrical operation. The remote control device of FIG. 5, however, includes an electroluminescent display 86 driven remotely from a control circuit having a driver providing (not shown in FIG. 5) energy to buses 87 and 88. These buses 87 and 88 are printed as conductive strips along two arms 89 and 90 of the molded plastic unit 80. The two arms 89 and 90 also carry buses 91 and 92 which connect to terminal ends 94 of a conventional switch circuit. In addition to carrying the buses (or conductors) to a control circuit terminal 96, the two arms 89 and 90 serve as a hinge to permit the switch end of the molded plastic unit 80 to freely move upon engagement into the unshown conductive portion of the switch for shorting the terminal ends 94 and informing the control circuit of the engagement. The electroluminescent display 86 is activated as described above in connection with FIGS. 3 and 4 or, depending on the application, in response to another condition. For example, when used as a driver control panel in an automobile application, backlighting for depressors of the molded plastic unit 80 can be activated in response to opening the vehicle door, the keys being inserted into the ignition slot and/or engine start-up.

In each of the above remote control devices, the control circuit is implemented in a form that best suits the application. Some more sophisticated applications may require a program-based control circuit, such as a microprocessor or an ASIC (application-specific integrated circuit). For other applications, the control circuit may be implemented using conventional discrete analog and/or digital logic, such as pull-up resistors, diodes and wired-OR type circuitry. For the above implementations in which a transmitter is being used, the transmitter type may also be selected and/or designed to meet the needs of the specific application. The inverter is also application-dependent. Included among the many inverter manufacturers are Motorola and NEC.

According to yet another aspect of the present invention, the electroluminescent display is manufactured by first applying the display conductors along with the switch conductors and buses where applicable. This is accomplished, e.g., by screen printing the conductors on, or etch-removing a previously-applied conductive layer from, a dielectric surface. The dielectric surface may be any of a number of different types of substantially nonconducting surfaces, including but not limited to the protective housing of an IC, mylar, paper or virtually any type of plastic. Over the conductors, a phosphor-based carrier is deposited so as to cover the area or areas between the first and second conductors carrying the drive signals from the electroluminescent inverter. Alternatively, the phosphor-based carrier is deposited first, followed by application of the conductors.

The plastic components, for example, used as supportive outer housings for the structures of FIGS. 3–5, are manufactured using conventional techniques. One such technique involves applying any needed graphics to the exposed side of a sheet of mylar, securing the conductors to the back side of the mylar as described above, forming the mylar as required by the application, cutting away and discarding the unused portion of the mylar, placing the remaining portion of the mylar into a mold and injecting plastic into the mold and onto the back side of the mylar.

Another aspect of the present invention is directed to improving the brightness of the device or as provided through the method, as described above, by applying a nonconductive material, such as DuPont 7153-type dielectric composition, over the patterned conductive buses, or by using another such material to increase capacitance between the alternately arranged conductors. It has been discovered that such implementation substantially increases the brightness. In a particular application, the brightness has been doubled by using a thin layer of a DuPont 7153-type nonconductive material applied directly over the entire patterned conductive areas.

Figure 6:
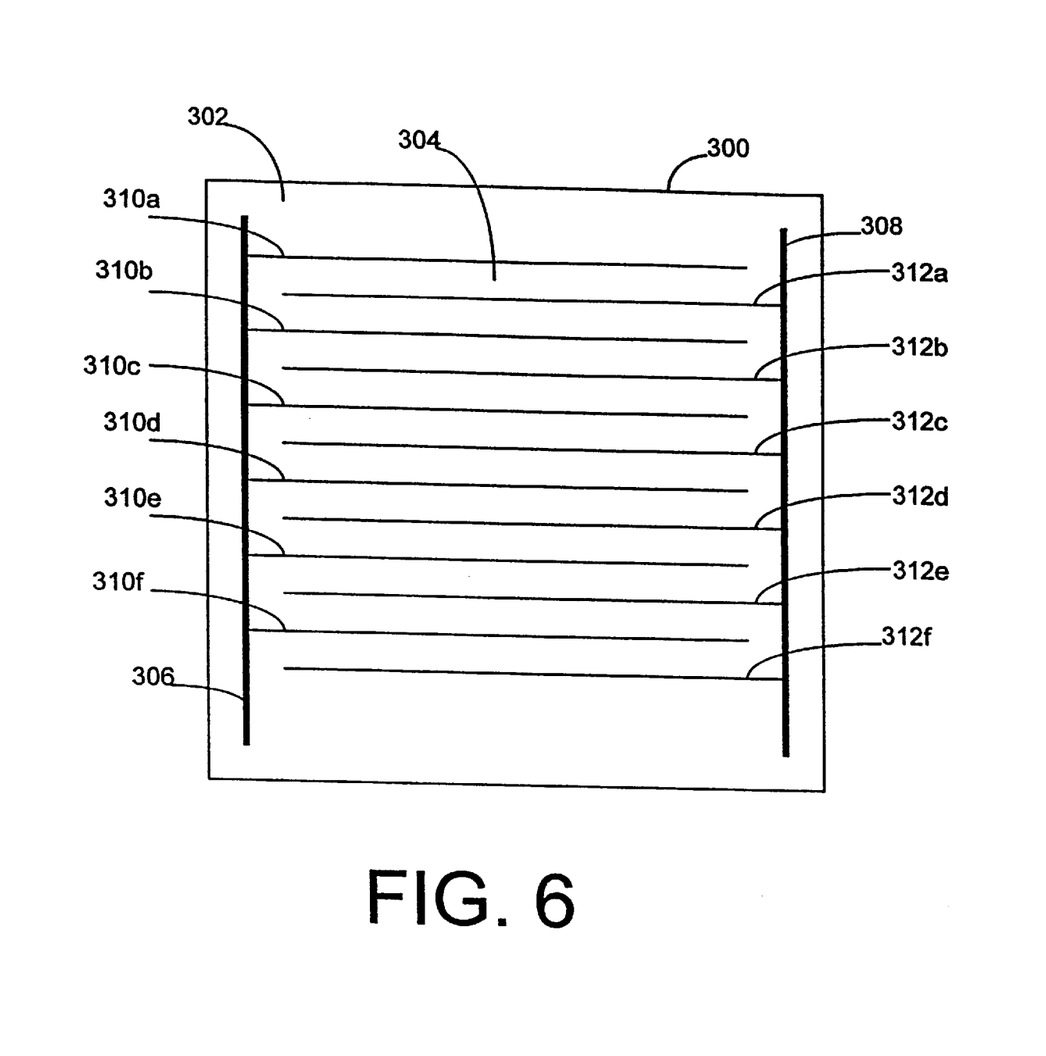
FIG. 6 is a view of an electroluminescent display arranged as part of a mirror, according to a particular application and embodiment of the present invention.

According to a particular embodiment of the present invention, illustrated in FIG. 6, an electroluminescent display is incorporated into a mirror 300. The mirror 300 has a metallized surface 302, on which a pattern of conductive traces is created using, for example, a laser (not shown) to etch the surface 302. Etching the surface 302 removes selected portions of the metallic coating, thus creating non-conductive areas. Those portions of the metallized surface 302 that are not etched away form conductive traces, e.g., bus conductors 306 and 308. A phosphor-based carrier 304 is applied on the metallized surface 302 between bus conductors 306 and 308 and/or between other conductors. A dielectric coating, such as DuPont 7153-type dielectric composition, is optionally applied to the metallized surface 302 before applying the phosphor-based carrier 304. In certain applications, it might be desirable to use a dielectric composition with different properties, e.g., dielectric strength and/or dielectric constant. The desired dielectric strength depends on, for example, the separation between the conductors and the magnitude of the voltage applied to the conductors.

In the example embodiment illustrated in FIG. 6, a plurality of first conductors 310a–310f and a plurality of second conductors 312a–312f are interleaved to create phosphor-energizable areas, one such area in the proximity of an opposing pair of conductors, e.g., conductors 310a and 312a. When an electric field is set up between such an opposing pair of conductors, a corresponding phosphor-energizable area emits light. This emitted light is visible through the front surface (not shown) of the mirror 300. It should be understood that patterns other than that illustrated in FIG. 6 can be created on the metallized surface 302, including, but not limited to, curvilinear and nonlinear patterns. For example, patterns can be created that are particularly useful for use in indicators, warnings, or other display types integrated into the mirror 300. Alternatively, light shapes may be designed by selectively distributing the phosphor so that only selected areas of the conductors emit light. This can be advantageous in a number of applications, for example, those in which high volumes of structures including the traces are available for processing with phosphor.

According to a particular embodiment of the present invention, a lamp can be incorporated as part of a liquid crystal display (LCD) to provide an integrated backlight. This can be done by incorporating the lamp on the LCD's transflector or to manufacture the two buses or conductors with ITO (indium tin oxide) etched directly on the back of the LCD.

According to yet another embodiment of the present invention, the conductive buses can be implemented using nonmetallic material, such as indium tin oxide. This aspect of the present invention is applicable to each of the various embodiments disclosed herein. Further, in applications where transparency throughout is desirable, a transparent ITO is effective in this regard.

According to another aspect of the present invention, an electroluminescent display is incorporated into a conventional electroluminescent polymer, such as implemented using the following formula: [to be supplied by the inventors], available from Uniax Corp. of Santa Barbara, Calif.

It will be apparent to those skilled in the art that various modifications and variations can be made to the embodiments illustrated herein without departing from the scope or spirit of the invention. Such modifications and variations do not depart from the true scope and spirit of the invention which is set forth by the following claims.

What is claimed is:

1. An electroluminescent display device, comprising:
    a mirror having a metallized surface selectively etched to define a first conductive bus having at least one first conductor and a second conductive bus having at least one second conductor arranged in close proximity to said at least one first conductor; and
    a phosphor-based carrier including phosphor therein and located proximate to the first and second conductors to permit an electric field set up by a voltage applied between the first and second conductors to generate light via the phosphor.

2. An electroluminescent display device, according to claim 1, further comprising a dielectric layer disposed between the conductors.

3. An electroluminescent display device, according to claim 1, wherein the mirror forms part of a liquid crystal display device.

4. An electroluminescent display device, comprising:
    a liquid crystal device including a mirror having a metallized surface selectively etched to define a first conductive bus having at least one first conductor and a second conductive bus having at least one second conductor arranged in close proximity to said at least one first conductor; and
    a phosphor-based carrier including phosphor therein and located proximate to the first and second conductors to permit an electric field set up by a voltage applied between the first and second conductors to generate light via the phosphor.

5. An electroluminescent display device, comprising:
    a dielectric carrier;
    a first conductive bus having at least one first conductor and a second conductive bus having at least one second conductor arranged in close proximity to said at least one first conductor, the first and second conductors secured over and supported by the dielectric carrier; and
    an electroluminescent phosphor-based medium located proximate to the first and second conductors to permit an electric field set up by a voltage applied between the first and second conductors to generate light via the phosphors.

6. An electroluminescent display device, comprising:
    a dielectric carrier;
    a first conductive bus having at least one first conductor and a second conductive bus having at least one second conductor arranged in close proximity to said at least one first conductor, the first and second conductors secured over and supported by the dielectric carrier; and
    an electroluminescent polymer medium located proximate to the first and second conductors to permit an electric field set up by a voltage applied between the first and second conductors.

* * * * *